United States Patent
Julian et al.

(10) Patent No.: US 10,782,371 B2
(45) Date of Patent: Sep. 22, 2020

(54) NMR APPARATUS WITH PERMANENT MAGNETS, MAGNETIC FIELD SENSORS, AND MAGNETIC COILS

(71) Applicant: X Development LLC, Mountain View, CA (US)

(72) Inventors: Dominico P. Julian, Oakland, CA (US); Pascal Pawel Stang, San Jose, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 16/120,144

(22) Filed: Aug. 31, 2018

(65) Prior Publication Data
US 2020/0072925 A1   Mar. 5, 2020

(51) Int. Cl.
*G01R 33/3875*   (2006.01)
*G01R 33/30*   (2006.01)
*G01R 33/383*   (2006.01)

(52) U.S. Cl.
CPC ......... *G01R 33/3875* (2013.01); *G01R 33/30* (2013.01); *G01R 33/383* (2013.01)

(58) Field of Classification Search
CPC .. G01R 33/30; G01R 33/383; G01R 33/3875; G01R 33/0094; G01R 33/243; G01R 33/3802; G01R 33/4814
USPC ................................................. 324/300–322
See application file for complete search history.

(56) References Cited

U.S. PATENT DOCUMENTS

| | | | |
|---|---|---|---|
| 3,510,832 A * | 5/1970 | Golay | G01R 33/389 324/320 |
| 6,735,461 B2 | 5/2004 | Vitek et al. | |
| 6,872,180 B2 | 3/2005 | Reinhardt et al. | |
| 2004/0267111 A1 | 12/2004 | Feinberg | |
| 2011/0137589 A1* | 6/2011 | Leskowitz | G01R 33/3875 702/57 |
| 2015/0032002 A1 | 1/2015 | Rothberg et al. | |
| 2017/0276747 A1* | 9/2017 | Hugon | H01F 13/003 |

(Continued)

OTHER PUBLICATIONS

Chonlathep et al. "A simple and low-cost permanent magnet system for NMR," Journal of Magnetic Resonance, vol. 275, Feb. 2017, 6 pages.

(Continued)

*Primary Examiner* — Jay Patidar
(74) *Attorney, Agent, or Firm* — Fish & Richardson P.C.

(57) ABSTRACT

A nuclear magnetic resonance (NMR) apparatus includes a pair of permanent magnets spaced apart from each other and defining a sample space, the permanent magnets providing a magnetic field in the sample space, an array of magnetic field sensors arranged relative to the sample space to provide, during operation, information about a homogeneity of the magnetic field, an array of magnetic coils arranged relative to the sample space so that each magnetic coil, during operation, generates a magnetic field that changes the magnetic field in the sample space, and an electronic controller programmed to receive information about the magnetic field from the array of magnetic field sensors and to variably energize the magnetic coils in the array of magnetic coils so that the magnetic fields generated by the array of magnetic coils reduces inhomogeneities of the magnetic field.

21 Claims, 9 Drawing Sheets

(56) References Cited

U.S. PATENT DOCUMENTS

2020/0069293 A1 3/2020 Julian et al.

OTHER PUBLICATIONS

Marks et al. "MRI-ultrasound fusion for guidance of targeted prostate biopsy," Curr Opin. Urol. Author manuscript, available Feb. 2013, [retrieved on Nov. 13, 2018] Retrieved from Internet:URL<https://www.ncbi.nlm.nih.gov/pmc/articles/PMC3581822/> 13 pages.

nanoscience.oxinst.com' [online] "Welcome to Oxford Instruments NanoScience," Copyright 2018, [retrieved on Nov. 13, 2018] Retrieved from Internet: URL<https://nanoscience.oxinst.com> 3 pages.

Pearson et al. "Shimming an NMR Magnet," Dec. 19, 2017 [retrieved on Nov. 13, 2018] Retrieved from Internet: URL<https://pharmacy.unc.edu/files/2015/07/Shimming-GAP-NMR-magnet.pdf> 16 pages.

phys.org' [online] "Portable MRI named Top 10 Breakthrough of 2015 by Physics World magazine," Dec. 14, 2015, [retrieved on Nov. 13, 2018] Retrieved from Internet: URL<https://phys.org/news/2015-12-portable-mri-breakthrough-physics-world.html> 3 pages.

physicsworld.com' [online] Portable 'battlefield MRI' comes out of the lab, Apr. 30, 2015, [retrieved on Nov. 9, 2018] Retrieved from Internet: URL<https://physicsworld.com/a/portable-battlefield-mri-comes-out-of-the-lab/> 3 pages.

Terada et al. "Magnetic Field Shimming of a permanent magnet using a conbination of pieces of permanent magnets and a single-channel shim coil for skeletal age assessment of childrem" Journal of Magnetic Resonance, May 2013, 9 pages.

'www.butterflynetwork.com' [online] "Meet iQ Personal Ultrasound," First available on or before Nov. 3, 2017, [retrieved on Nov. 9, 2018] Retrieved from Internet: URL<https://www.butterflynetwork.com/> 8 pages.

www.en.wikipedia.org' [online] "Benchtop nuclear magnetic resonance spectrometer," Last Updated: Oct. 31, 2018, [retrieved on Nov. 13, 2018] Retrieved from Internet: URL<https://en.wikipedia.org/wiki/Benchtop_nuclear_magnetic_resonance_spectrometer> 5 pages.

www.statnews.com' [online] "Episode 11: Building tomorrow's MRI—faster, smaller and cheaper," Carl Zimmer, Feb. 3, 2017 [retrieved on Nov. 13, 2018] Retrieved from Internet:URL<https://www.statnews.com/2017/02/03/mri-scanner-development/> 3 pages.

www.technologyreview.com' [online] "Cheap, Portable MRI," Courtney Humphries, Sep. 14, 2006, [retrieved on Nov. 13, 2018] Retrieved from Internet:URL<https://www.technologyreview.com/s/406510/cheap-portable-mri/> 6 pages.

\* cited by examiner

NMR APPARATUS WITH PERMANENT MAGNETS, MAGNETIC FIELD SENSORS, AND MAGNETIC COILS

FIELD

The disclosure relates to nuclear magnetic resonance systems and imaging systems that include magnetic resonance imaging, including fused sensor systems.

BACKGROUND

Highly homogeneous magnetic fields (e.g., <10 ppm variation over the usable sample space) are typically needed for nuclear magnetic resonance (NMR) applications, including NMR spectrometry and magnetic resonance imaging (MRI). MRI imaging typically require magnetic fields that have high field strength. For example, commercial systems generally operate at fields in a range from 0.1 T to 7 T, with many operating at fields of about 1.5 T. The magnetic field is provided by a magnet, such as an electromagnet, a permanent magnet, or a superconducting magnet.

Resistive magnets are electromagnets that use a high and constant power supply to create the magnetic field. Permanent magnets are commonly composed of ferromagnetic substances and create a magnetic field that is maintained without an external power supply. Superconducting magnets are typically formed from a coil made from a superconducting material (e.g., niobium-titanium alloy). Such materials generally only become superconducting a low temperatures (e.g., less than 100 degrees Kelvin), so involve use of cryogens for cooling during use.

SUMMARY

Permanent magnets (e.g., formed from rare earth elements) often don't provide sufficiently homogeneous magnetic fields for clinical MRI and other applications demanding highly homogeneous fields. However, field inhomogeneities can be reduced using an array of magnetic field sensors arranged to sense field inhomogeneities and an array of magnetic coils that are selectively energized to spatially modify the field strength in the sample space to reduce field variations across the space. The arrays can be integrated into a single assembly or can be separate. More than one array, each having different orientations, can be used to provide additional degrees of freedom for homogenizing the magnetic field.

Sensor arrays can also be used during the preparation of permanent magnets for use in NMR systems, including MRI systems. In particular, magnetic material can be locally removed from one or both of the permanent magnets surfaces to reduce field inhomogeneities measured using a sensor array.

Various aspects of the invention are summarized as follows.

In general, in one aspect, the invention features a nuclear magnetic resonance (NMR) apparatus, including a pair of permanent magnets spaced apart from each other and defining a sample space, the permanent magnets providing a magnetic field in the sample space, an array of magnetic field sensors arranged relative to the sample space to provide, during operation, information about a homogeneity of the magnetic field in the sample space, an array of magnetic coils arranged relative to the sample space so that each magnetic coil, during operation, generates a magnetic field that changes the magnetic field in the sample space provided by the permanent magnets, and an electronic controller in communication with the array of magnetic field sensors and the array of magnetic coils, the controller being programmed to receive information about the magnetic field in the sample space from the array of magnetic field sensors and to variably energize the magnetic coils in the array of magnetic coils so that the magnetic fields generated by the array of magnetic coils reduces inhomogeneities of the magnetic field in the sample space.

Embodiments of the NMR apparatus can include one or more of the following features and/or features of other aspects. For example, the permanent magnets can include a rare earth magnetic material, such as neodymium or samarium-cobalt.

The array of magnetic field sensors can include Hall effect sensors, magneto-diodes, magneto-transistors, AMR magnetometers, GMR magnetometers, magnetic tunnel junction magnetometers, magneto-optical sensors, Lorentz force based MEMS sensors, Electron Tunneling based MEMS sensors, MEMS compasses, Nuclear precession magnetic field sensors, optically pumped magnetic field sensors, fluxgate magnetometers, search coil magnetic field sensors or SQUID magnetometers.

In some embodiments, the array of magnetic coils include a plurality of electrically-conducting wires each wound around a respective axis. Each wire can be printed on a substrate.

The array of magnetic coils can include a plurality of substrates stacked on top of one another, each supporting a respective array of wires, each wire being wound around a respective axis. Each wire in a one of the respective arrays can be wound around a common axis as a wire in each of the other arrays.

The apparatus can further include a substrate supporting both the array of magnetic field sensors and the array of magnetic coils. The array of magnetic field sensors and the array of magnetic coils can be on opposing sides of the substrate. The substrate can include a printed circuit board.

In some embodiments, the apparatus further includes a housing containing the pair of permanent magnets, the array of magnetic field sensors, and the array of magnetic coils, the housing being sized and shaped for handheld use. The pair of permanent magnets can be arranged to provide a fringe field in a volume adjacent the housing. The apparatus can include one or more RF coils positioned between the pair of permanent magnets. The electronic controller can include at least one computer processor housed external from the housing and at least one component internal to the housing in communication with the at least one computer processor. The at least one component and at least one computer processor can be in wireless communication.

The apparatus can include a power source, e.g., a battery, arranged in the housing. Alternatively, or additionally, the apparatus can be connected to an external power source.

The apparatus can be a nuclear magnetic resonance (NMR) spectrometer or a magnetic resonance imaging (MRI) system.

In general, in a further aspect, the invention features an apparatus that includes a housing including a first surface, an ultrasound transducer arranged in the housing and positioned relative to the first surface to direct ultrasound signals to a volume of a subject external to the housing adjacent the surface and detect reflected ultrasound signals from the volume of the subject responsive to the directed ultrasound signals during operation of the apparatus, a magnet arranged in the housing and positioned relative to the surface such that a magnetic field of the magnet penetrates the volume of the subject external to the housing adjacent to the surface, a radiofrequency (RF) system including one or more RF coils arranged in the housing and positioned relative to the first surface to perturb a nuclear spin polarization of nuclei in the volume of the subject and detect radio waves emitted from the volume of the subject in response to the perturbations during operation of the apparatus, and an electronic controller in communication with the ultrasound transducer and the RF system, the electronic controller being programmed to compile an image of at least a first region of the subject based on the detected ultrasound signals and compile a magnetic resonance image of at least a second region of the subject based on the detected radio waves.

Embodiments of the apparatus can include one or more of the following features and/or features of other aspects. For example, the housing can be sized and shaped for handheld use.

The magnet can include a permanent magnet or electromagnet. The permanent magnetic can include two pieces of a magnetic material spaced apart from each other or a ring magnet defining a hole. The two pieces of magnetic material or ring magnet can be arranged to provide a fringe field in the volume of the subject. The ultrasound transducer can be positioned between the two pieces of magnetic material or in the hole in the ring magnet. The one or more RF coils can be positioned between the two pieces of magnetic material or in the hole of the ring magnet.

The apparatus can include an actuator for displacing the magnetic and/or the one or more RF coils relative to the surface to vary a magnetic field strength in the volume of subject.

The ultrasound transducer can include an integrated circuit comprising an array of transducer elements.

The electronic controller can include at least one computer processor housed external from the housing and at least one component internal to the housing in communication with the at least one computer processor. The at least one component and at least one computer processor can be in wireless communication.

The apparatus can include a power source, e.g., a battery, arranged in the housing.

The first and second regions can at least partially overlap.

In general, in another aspect, the invention features a method that includes: directing, using an ultrasound transducer, ultrasound signals to a volume of a subject and detecting reflected ultrasound signals from the volume of the subject in response to the directed signals; providing, using a magnet, a magnetic field in the volume of the subject while directing the ultrasound signals, wherein the ultrasound transducer and the magnet are arranged in a common housing; perturbing the magnetic field in the volume of the subject and detecting radio waves emitted from the volume of the subject in response to the perturbations; moving the common housing relative to the subject to vary the volume receiving the ultrasound signals and the magnetic field; compiling an image of at least a first region of the subject based on the detected ultrasound signals; and compiling a magnetic resonance image of at least a second region of the subject based on the detected radio waves, wherein the first and second regions at least partially overlap.

Among other advantages, the invention can enable use of permanent magnets in NMR applications that conventionally utilize expensive and bulky electromagnets and/or superconducting magnets. For example, an array of magnetic field strength detectors can be used in conjunction with an array of magnetic coils to locally increase or decrease the strength of the magnetic field provided by the permanent magnets in order to reduce field inhomogeneities detected using the sensor array. This can allow for use of permanent magnet systems in environments where temperature and other fluctuations might otherwise render the magnets too unstable for reliable measurements.

In certain embodiments, the invention can facilitate manufacturing of permanent magnets suitable for NMR applications in a manner that improves the homogeneity of the magnetic field produced by the magnets. For example, magnetic field sensor arrays can be used during the manufacturing and/or assembly process to measure the homogeneity of the magnetic field produced by magnets and the shape of the magnets adjusted to improve field homogeneity.

In some embodiments, the invention includes compact sensors that provide multiple imaging modalities, such as sensors that provide both MRI and ultrasound imaging of a common sample space. Such sensors may be sufficiently compact to be provided in a handheld form factor.

Other advantages will be apparent from the description below and the claims.

BRIEF DESCRIPTION OF THE DRAWINGS

Like reference numbers and designations in the various drawings indicate like elements.

DETAILED DESCRIPTION

NMR systems, including MRI systems, are disclosed that use permanent magnets to produce their magnetic fields. Inhomogeneities in the associated magnetic field are mitigated by use of a magnetic field measuring array placed either in within the bore of an NMR machine or in a fringe field, depending on the configuration. The field measuring array works in conjunction with a magnetic coil array to locally increase or decrease magnetic field strength sample volume of the system, thereby reducing field strength homogeneities.

Figure 1:
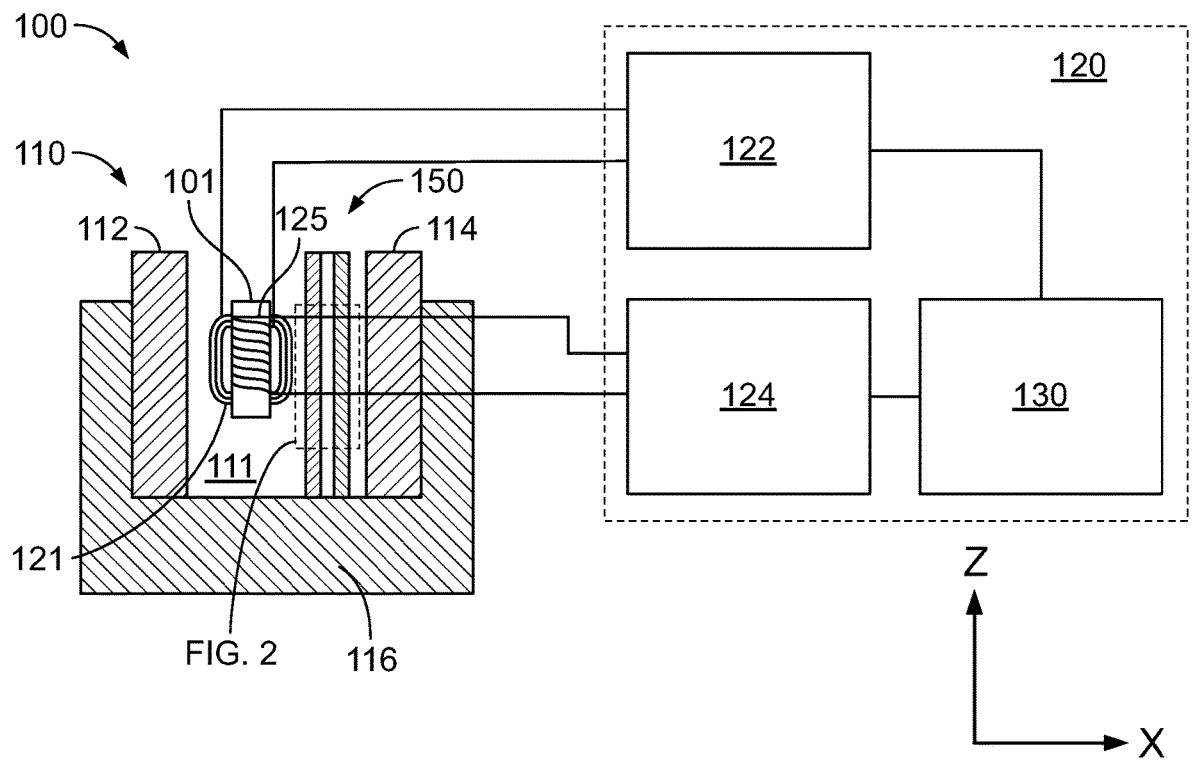
FIG. 1 is a schematic view of an embodiment of a nuclear magnetic resonance (NMR) system.

For example, referring to FIG. 1, a NMR spectrometry system 100 includes an NMR assembly 110 that features a pair of permanent magnets 112 and 114 positioned on opposing sides of a sample space in which a sample 101 is placed. Magnets 112 and 114 are secured relative to each other by a high magnetic permeability rigid frame 116. The magnets' respective poles are aligned such that a nominally uniform magnetic field permeates the sample space, e.g., along the x-axis of the coordinate system shown in FIG. 1.

System 100 further includes a RF coil 121 and a pick up coil 125 that is coiled around sample 101. In some embodiments, coils 121 and 125 may be one in the same. An electronic controller 120 activates RF coil 121 at a desired Larmor frequency and measures the sample response thereto in pick up coil 125. To perform these operations, controller 120 includes a RF transmitter 122, a RF receiver and amplifier 124, and a control and data processing module 130.

Permanent magnets 112 and 114 are formed to provide a magnetic field to the sample space having a nominal magnetic field strength, $B_0$, sufficient to enable NMR spectrometry measurements of sample compounds. In general, the nominal magnetic field strength can vary depending on the application and the desired sensitivity of the system. Typically, a higher nominal magnetic field strength will yield a more sensitive instrument and a corresponding ability to accurately characterize increasingly complex molecules. In some implementations, nominal magnetic field strength is in a range from about 0.2 T to about 1.0 T. In general, a variety of materials can be used for permanent magnets 112 and 114. For example, neodymium or samarium-cobalt materials can be used.

Ideally, permanent magnetics 112 and 114 provide a perfectly uniform magnetic field across the sample space (i.e., the local field strength is $B_0$ across the sample space). However, practically, it is seldom possible to provide a field free of inhomogeneities. Accordingly, in order to reduce the effects of field inhomogeneities due to, e.g., variations in thickness and/or composition of magnets 112 and 114, sample 101 may be spun on an axis during operation. In addition, assembly 110 includes a field adjustment module 150 also placed in the sample space adjacent to sample 101.

Figure 2:
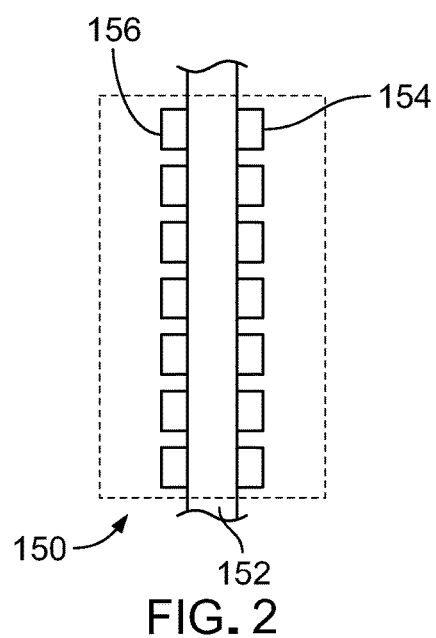
FIG. 2 is a schematic view of a section of the sensor-coil array in the NMR system shown in FIG. 1.

Referring to FIG. 2, field adjustment module 150 includes a 152 support, a sensor array 154 located on one side of support 152, and a coil array 156 on the opposite side of support 152. Although illustrated in cross-section, arrays 154 and 156 both extend in two dimensions, providing arrays that intersect the sample volume through its width and depth.

Sensor array 154 is composed of an array of magnetic field sensors each providing a measurement of a local magnetic field strength. In general, each sensor in the array should be capable of measuring a magnetic field strength of $B_0$ with sufficient sensitivity to identify small variations of magnetic field strength from $B_0$. For example, each sensor should be capable of measuring magnetic field variations of $10^{-5}$ T or less (e.g., $5 \times 10^{-6}$ T or less, $10^{-6}$ T or less, $5 \times 10^{-7}$ T or less, $10^{-7}$ T or less, $5 \times 10^{-8}$ T or less) at magnetic fields of 0.5 T or more (e.g., 1 T or more, 1.5 T or more, 2 T or more). In addition, each sensor should be sufficiently compact so that multiple of each can be arrayed on a surface area spanning the sample space.

A variety of magnetic field sensor types may be used, such as, Hall effect sensors, magneto-diodes, magneto-transistors, AMR magnetometers, GMR magnetometers, magnetic tunnel junction magnetometers, magneto-optical sensors, Lorentz force based MEMS sensors, Electron Tunneling based MEMS sensors, MEMS compasses, Nuclear precession magnetic field sensors, optically pumped magnetic field sensors, fluxgate magnetometers, search coil magnetic field sensors or SQUID magnetometers. In some embodiments, each sensor in array 154 is the same type of sensor. Alternatively, different sensors can be used in an array. For example, in some embodiments, the array is composed of two or more different sensor types, e.g., at alternating array locations. In some embodiments, array 154 can include different types of sensor stacked on top of each other.

Coil array 156 is composed of an array of magnetic coils that can be selectively energized to provide a local magnetic field in the sample space. Generally, the coils are formed from an electrically-conductive material and each are separately connected to a variable current source. The number of windings in each coil, as well as the nature of each, are selected so that the coil can support an electrical current sufficient for the coil to generate a local magnetic field strength adequate compensate for local variations of the magnetic field in the sample space from the nominal magnetic field strength, $B_0$. For example, each coil may be capable of generating a local magnetic field of $10^{-6}$ T or more (e.g., $10^{-5}$ T or more, $10^{-4}$ T or more, $10^{-3}$ T or more).

In general, the size of magnetic field sensor array 154 and coil array 156 and the density of array elements in each can vary as necessary to provide sufficient coverage of the sample volume at a desired spatial resolution. In some embodiments, the arrays have a lateral area in a range from 1 cm² to about 100 cm² or more. Array element density in each array can be in a range of about 1 per cm² to 100 per cm² or more. The arrays can have the same number of elements or they can be arrays of different size. In some embodiments, each magnetic field sensor in array 154 has a corresponding coil in array 156 in a corresponding position on the opposite side of support 152 (e.g., directly opposing support 152).

Generally, support 152 can be formed from any material that provide sufficient mechanical support for the arrays and associated wiring for connecting each array element. In some embodiments, support 152 is a printed circuit board.

Figure 3A:
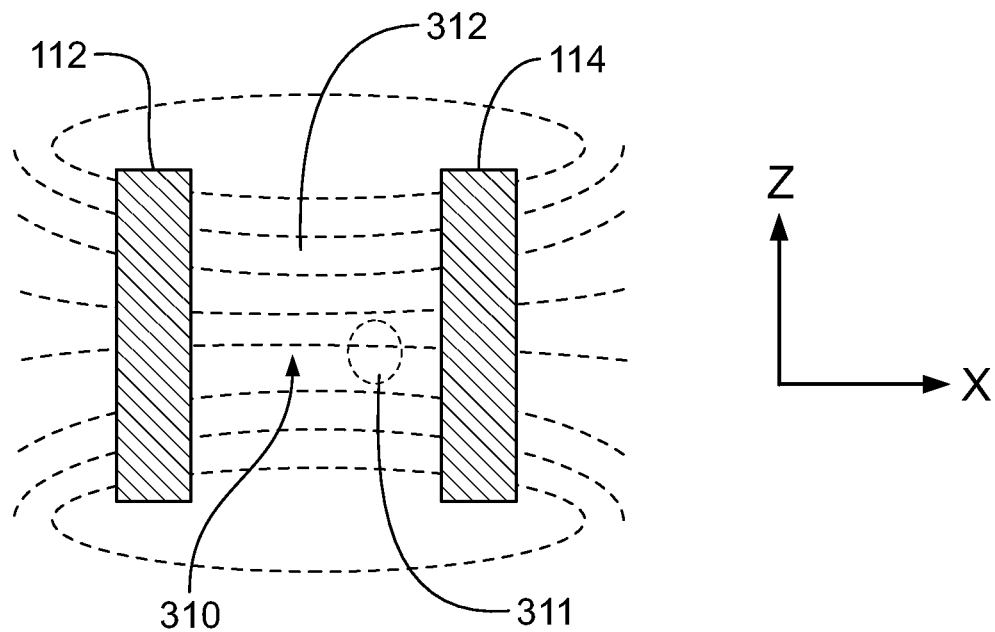
FIGS. 3A and 3B are schematic diagrams illustrating the operation of the sensor-coil array shown in FIGS. 1 and 2.
Figure 3B:
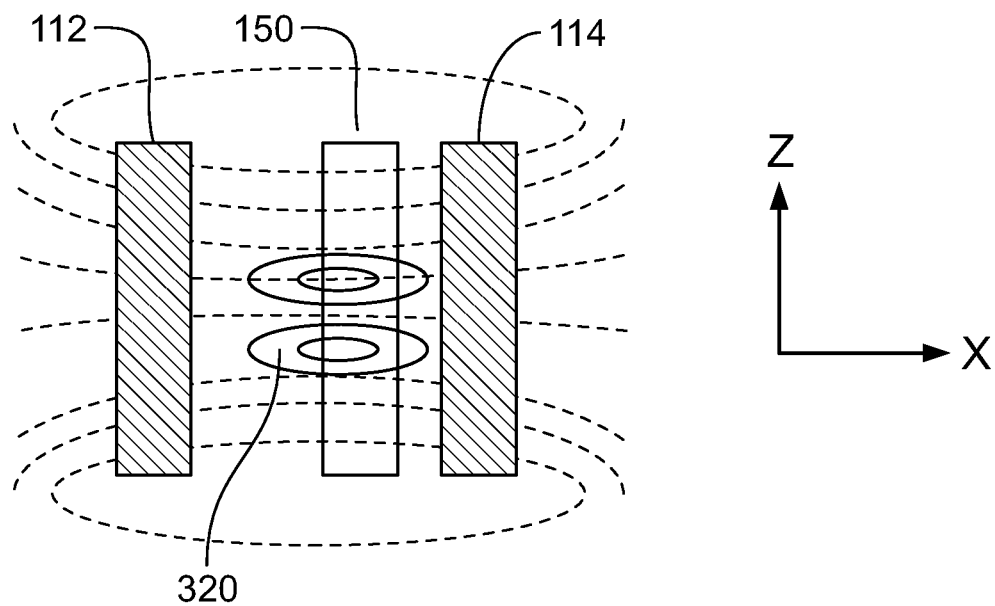

Operation of field adjustment module 150 is illustrated in FIGS. 3A and 3B. Specifically, FIG. 3A illustrates an inhomogeneous magnetic field in the sample space 310 between magnets 112 and 114. Specifically, sample space 310 includes a region 312 which has the nominal magnetic field strength $B_0$ as indicated by magnetic field lines having a first density. Sample space 310 also includes a region 311 having a lower field strength, $B_0 - \Delta B$, as indicated by magnetic field lines having a lower density that region 312.

During a field homogenization procedure, the system acquires a field strength map using magnetic field sensor array 154 by measuring a local field strength with each sensor in the array. The system compares each sensor measurement to the nominal magnetic field strength and where a variation from $B_0$ is located, energizes one or more corresponding coils in array 156 with a current sufficient to generate a local magnetic field to reduce (e.g., eliminate) the local variation from $B_0$.

Accordingly, FIG. 3B shows the magnetic field lines when the magnetic field lines from magnets 112 and 114 are supplemented by activated coils in array 156. Here, the low field strength region 311 corresponding to the lower density in field lines is increased by the activation of the coils proximate to region 311, as illustrated by field lines 320. The result is a reduction in magnetic field inhomogeneities in the sample space of NMR system 100. In other words, the coils are used to shim the magnetic field in NMR system 100.

Field adjustment module 150 can be operated in a variety of ways to reduce field inhomogeneities during operation. For example, the module can be activated at startup of system during a calibration procedure. In some embodiments, the calibration procedure can be rerun each time a new sample is inserted in the sample space. Alternatively, or additionally, sensor measurements can be performed intermittently or continuously during measurement. A cycle of measurements and field adjustment can be used in a feedback loop to progressively reduce field strength variations until the desired homogeneity is reached.

Generally, field adjustment module is controlled by controller 120, which can coordinate initiation of a measurement once adequate field homogenization is achieved. In some embodiments, the field adjustment is performed by measuring the highest local magnetic field strength in the same volume and then increasing the field strength in regions of lower field strength using the coil array.

Figure 4A:
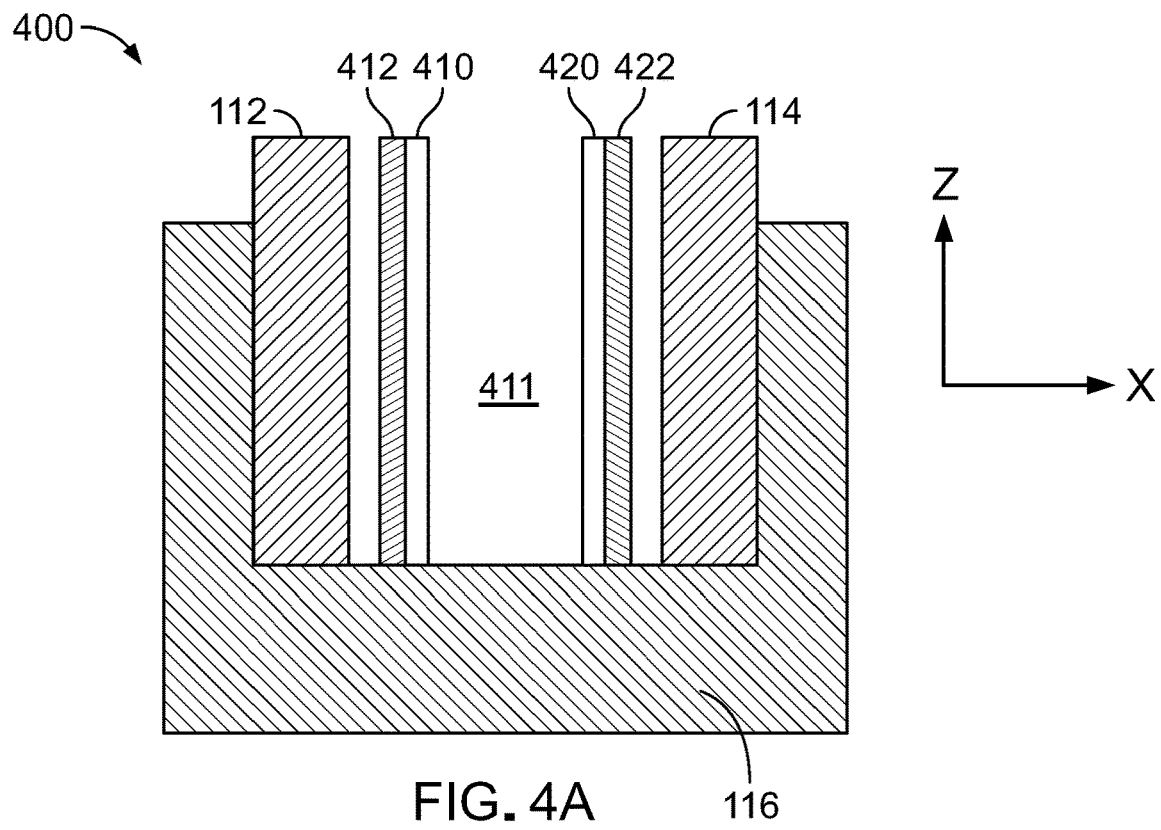
FIG. 4A is a schematic view of a portion of another embodiment of a NMR system.

While the foregoing implementations feature a magnetic field sensor array and a coil array on opposing sides of a common support, other arrangements are also possible. For example, referring to FIG. 4A, in some embodiments, the coil and sensor arrays can be arranged on different substrates. Here, a NMR assembly 400 is composed of magnets 112 and 114 and magnetic circuit frame 116, while a sensor array 410 and a coil array 420 are arranged on opposing sides of the sample space, each supported by respective substrates 412 and 422. Other configurations are also possible. For instance, in some embodiments, more than one sensor array and/or more than one coil array can be used. For example, multiple sensor arrays can be used to measure field strength through different (e.g., non-parallel) sections through the sample space. The different sensor arrays can collectively provide information about magnetic field inhomogeneities along multiple different axes. Alternatively, or additionally, multiple coil arrays can be used to provide additional degrees of freedom in homogenizing the magnetic field.

Moreover, in the foregoing examples, the sample space is located between permanent magnets 112 and 114. However, other arrangements are also possible. For example, in some embodiments, the sample space can be located to utilize the fringe field generated by a pair of a permanent magnets (see, e.g., the devices described with regard to FIGS. 7A, 7B, and 8, below).

Figure 4B:
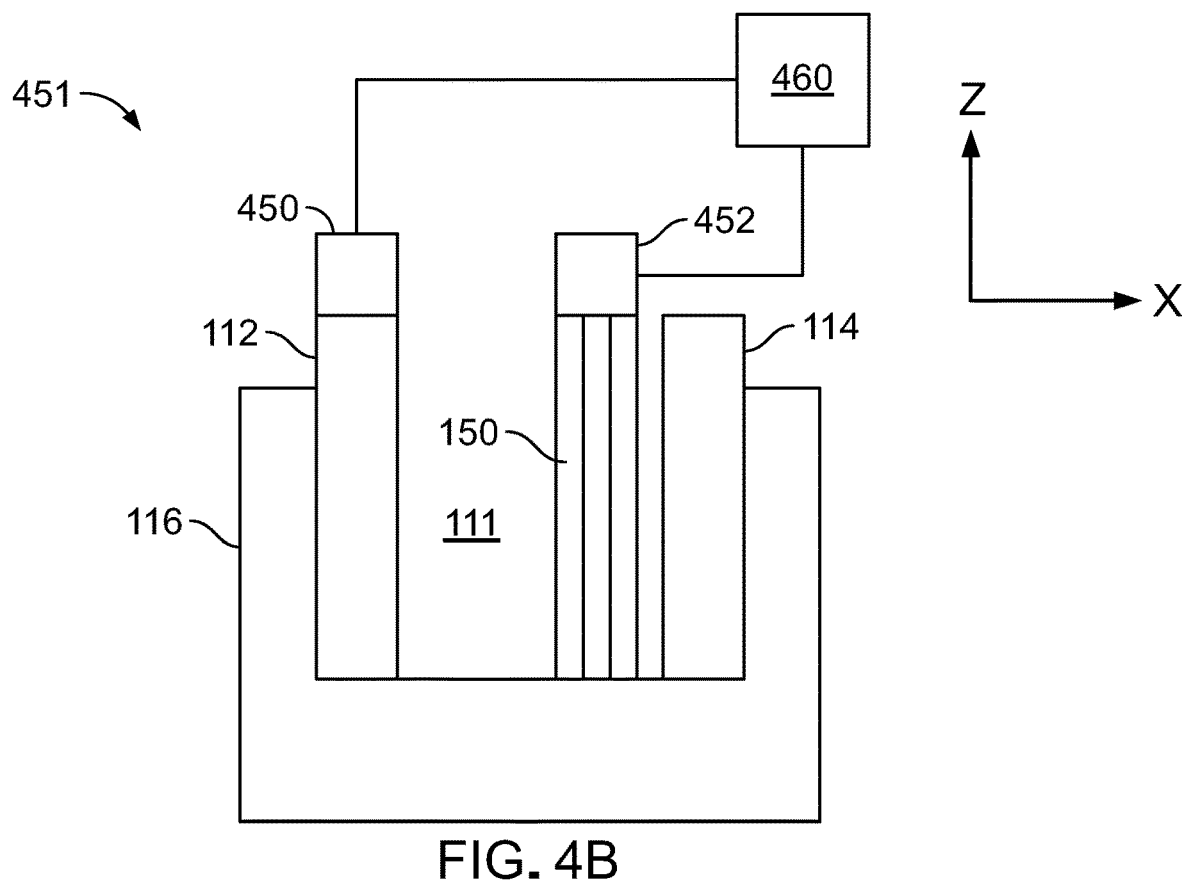
FIG. 4B is a schematic view of a portion of a further embodiment of a NMR system.

In some embodiments, one or both of the permanent magnets and/or the sensor and/or coil arrays can be actuable to allow the system to reposition these components relative to one another and/or relative to the sample space. For example, referring to FIG. 4B, an NMR assembly 451 includes actuators 450 and 452 coupled to magnet 112 and field adjustment module 150, respectively. The respective actuators move (e.g., rotate and/or displace) magnet 112 and module 150 relative sample space 111. Actuators 450 and 452 are in communication with controller 460, which provides control signals to each of the actuators to control their respective motion.

In some embodiments, actuators 450 and 452 are both multiple degree-of-freedom actuators. In other words, each can translate and/or rotate along more than one axis. For example, actuator 450 can be used to translate magnet 112 along the x, y, and/or z axis, and/or rotate the magnet about each of these axes. Similarly, actuator 452 can be used to translate module 150 along the x, y, and/or z axis, and/or rotate the module about each of these axes.

The use of actuators can allow the system to dynamically create a desired field strength or pattern at a particular location within sample space 111. For example, the actuators allow for fine adjustment of either or both module 150 and magnet 112 with respect to a sample to ensure the field strength and/or homogeneity is optimal for that sample.

Actuators can also be used to assist in calibrating the system. For example, during a calibration procedure, the system can rotate magnet 112 about the x-axis while measuring field variations. These variations can be attributed to inhomogeneities in the magnet, which can then be accounted for during actual measurements. Alternatively, or additionally, translations of the magnet or sensor module can be used in a calibration process too. For instance, in embodiments where the sample space is larger than the sensor array, the array can be moved to different portions of the sample space to provide calibration thereof. In some embodiments, magnet or sensor motion can be used to reduce the number of dedicated field sensors needed to calibrate a sample space (e.g., translating a one-dimensional sensor array can be used instead of a two-dimensional sensor array). Alternatively, or additionally, component actuation can allow smaller sensor elements to be used, because the actuators facilitate repositioning of the smaller sensors relative to other components so that they can still probe or manipulate the local field strength with the desired resolution.

Figure 5:
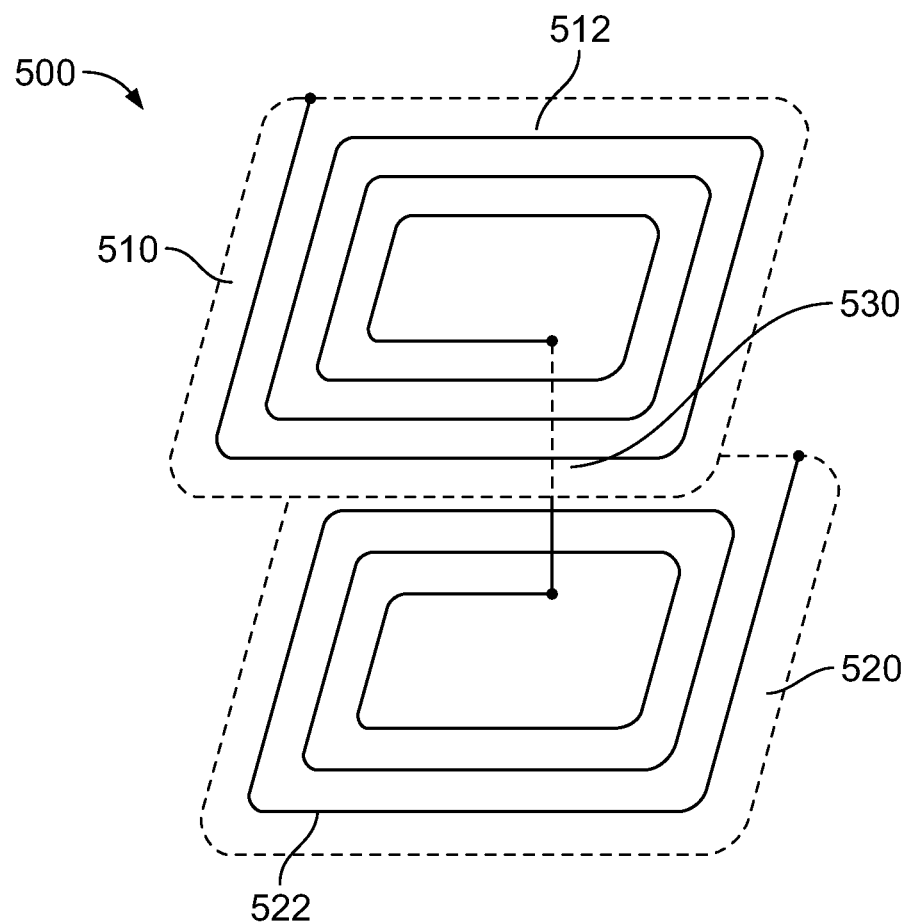
FIG. 5 is a perspective view of an embodiment of a coil in a sensor-coil array.

In some embodiments, multilayer coils can be used for coil array 156. For example, referring to FIG. 5, a multilayer coil 500 is composed of two coils—coils 512 and 522—stacked one of top of the other. Each coil is supported by a corresponding substrate (e.g., PCBs), substrates 510 and 520, respectively. Coils 512 and 522 share a common axis and a wire 530 electrically connects coil 512 to coil 522. Accordingly, both of the layered coils can be activated by a single current source. Alternatively, layered coils can be electrically isolated from one another and each are energized by its own, separate current source.

More generally, more than two coil layers (e.g., three layers, four layers, five layers, or more) can be stacked in order to provide a larger field response at each coil location in the array. Also, in general, the coils in each layer can have the same number of windings, or different numbers of windings. In some embodiments, the number of windings in successive layers are increased by a factor of two (e.g., the first coil has one winding, the second has two, the third has four windings, the fourth coil has eight windings, etc.), providing the ability to provide a wide range of different field strengths by selectively activating a select subset of the coils.

In some embodiments, multiple sensor arrays and/or multiple coil arrays can be used to improve field homogeneity. For example, sensor arrays can be positioned in different locations and/or having differing orientations in the same space and/or outside of the sample space (but still in proximity to the magnetic field) and can be used to measure field strength in multiple dimensions. In some embodiments, a full three-dimensional field line vector map can be acquired. Alternatively, or additionally, in some embodiments, multiple coil arrays are positioned in different positions and/or different orientations in the sample space and/or outside of the sample space. In such arrangements, the different coil arrays can allow for multi-dimensional adjustment of the local magnetic field strength.

In some embodiments, magnetic sensor arrays can be used when shaping a permanent magnet for an NMR system. For example, in some implementations, a sensor array such as array 154 is used to measured field homogeneity in the sample space of the NMR system during assembly of the system, for example by determining a field strength map of the magnetic field in the sample space. One or both of magnets 112 and 114 can then be adjusted and the map re-measured to assess whether field strength inhomogeneities are reduced. The adjustments can take a variety of forms. For example, the relative position of magnet 112 to magnet 114 can be adjusted. In some embodiments, small amounts of the permanent magnet material is removed from the surface of either or both of magnets 112 and 114 to reduce field inhomogeneities. Generally, different material removal methods can be used. For example, material can be removed using EDM, micromachining, and/or chemical etching. Material can be removed while the magnet is positioned in frame 116 or the magnet can be removed and replaced once the material is removed.

In some embodiments, the sensor array can be used to monitor changes in the magnetic field while a magnet is being machined, providing real time feedback. The measurements and adjustment process can be automated, allowing a computer to adjust the magnet or magnets in a feedback fashion until a threshold requirement for field homogeneity is achieved.

The result is a magnet that is shaped such that its local magnetic field strength and gap is adjusted to provide a more homogeneous magnetic field than the prior arrangement. The measurement and removal process may be repeated to iteratively improve field uniformity.

Figure 6:
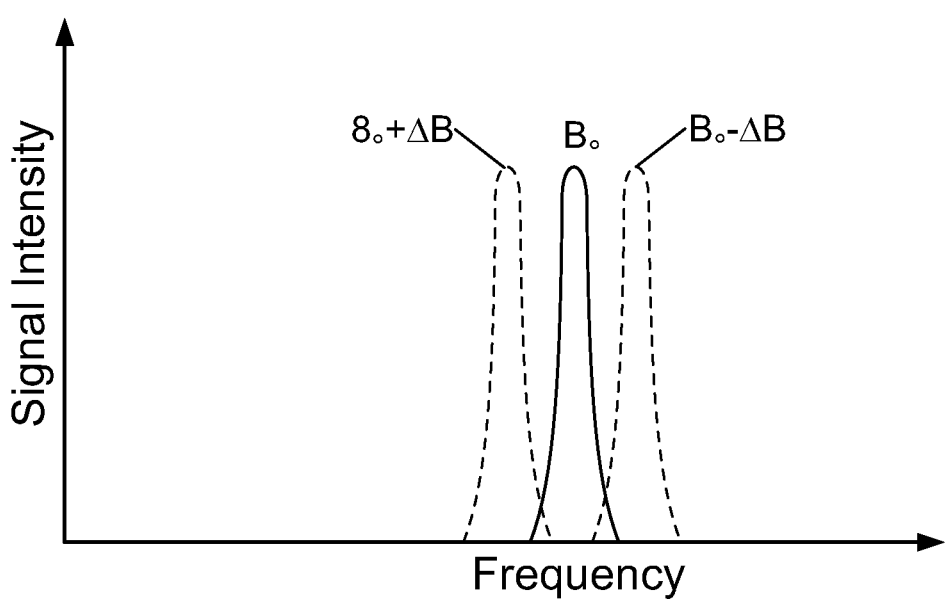
FIG. 6 is a plot illustrating the effect of variations in magnetic field strength on an NMR spectrum.

In some embodiments, as an alternative or in addition to using a coil array to shim the permanent magnet, the system can account for inhomogeneities in the magnetic field in the analysis of data obtained from the magnetic sensor array. For example, the system can acquire local magnetic field strength measurements during NMR (e.g., MRI) data acquisition using a sensor array and make adjustments in subsequent or contemporaneous analysis of the data. It is well-known that the Larmor frequency of a nucleus is proportional to the external field strength experienced by the nucleus. Accordingly, the RF frequency of a signal from a given molecule will vary slightly depending on the magnetic field strength of the applied field. This effect is illustrated by the plot in FIG. 6 which shows a plot of signal intensity as a function of RF frequency. A system with a nominal field strength, $B_0$, will expect a specific nucleus (e.g., a deuterium nucleus) to produce a signal produce at a corresponding RF frequency, $f_0$. The frequency at which this signal is measured will shift to a lower RF frequency at a slightly higher magnetic field strength ($B_0+\Delta B$), while the signal will shift to slightly higher RF frequency for a lower magnetic field strength ($B_0-\Delta B$). However, where the local variation ($\Delta B$) from $B_0$ is known, such as from measurements made with a sensor array, the analysis software can account for the associated signal shifts and make appropriate corrections.

In some embodiments, the system can utilize a sample volume map (i.e., knowledge of how much sample material is in each measurement region). The $\Delta B$ values and sample volume map are both utilized by the analysis software for associated signal shift corrections (frequency and amplitude, respectively). The sample volume map can be obtained from knowledge of the sample containment vial geometry and/or based on assumptions of the sample like full volume in single sided NMR/MRI, and/or with various sensors which measure the shape of the sample volume (e.g.; laser-based or acoustic-based measurements).

While the foregoing embodiments and discussion are in the context of NMR spectroscopy system 100, more generally, the concepts disclosed can be applied to other NMR systems too. For example, MRI systems can utilize the disclosed principles.

Figure 7A:
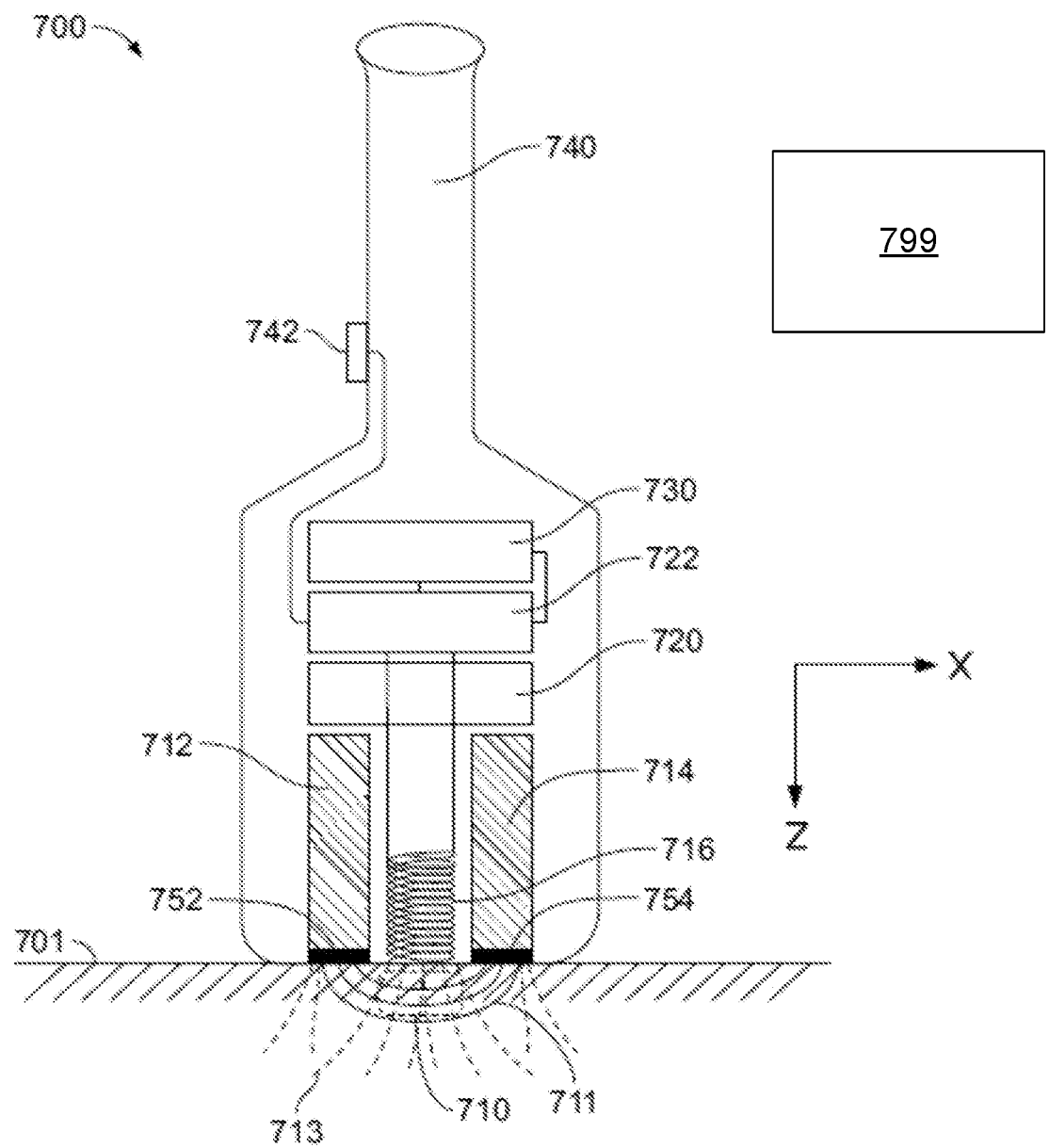
FIG. 7A is a schematic diagram of an embodiment of a handheld magnetic resonance imaging (MRI) device.
Figure 7B:
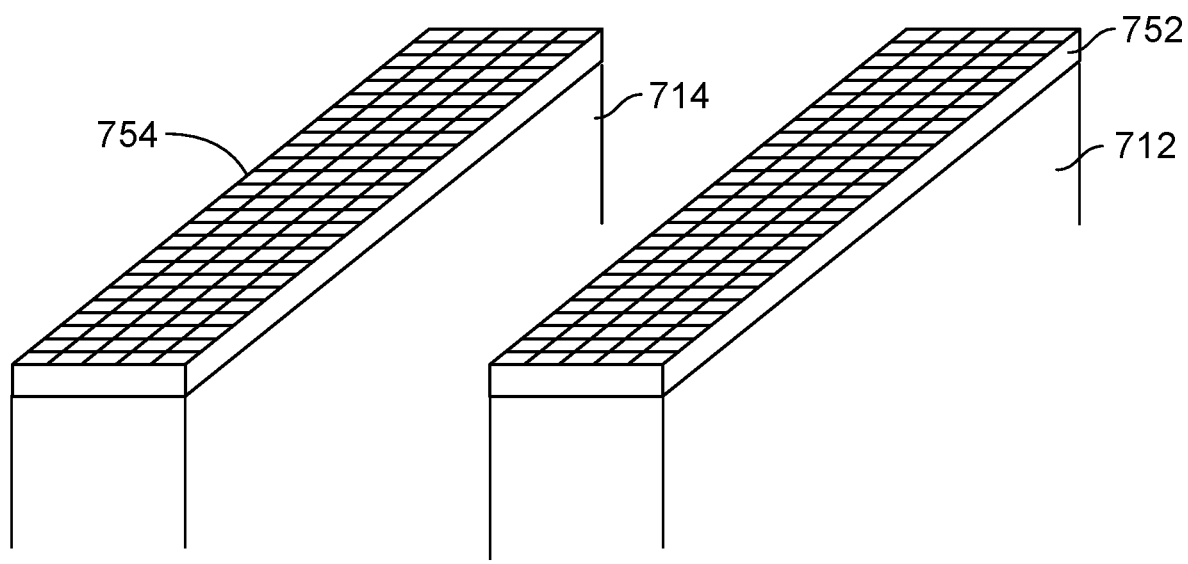
FIG. 7B is a perspective view of a portion of the handheld MRI device shown in FIG. 7A, illustrating the sensor and coil array in particular.
Figure 8A:
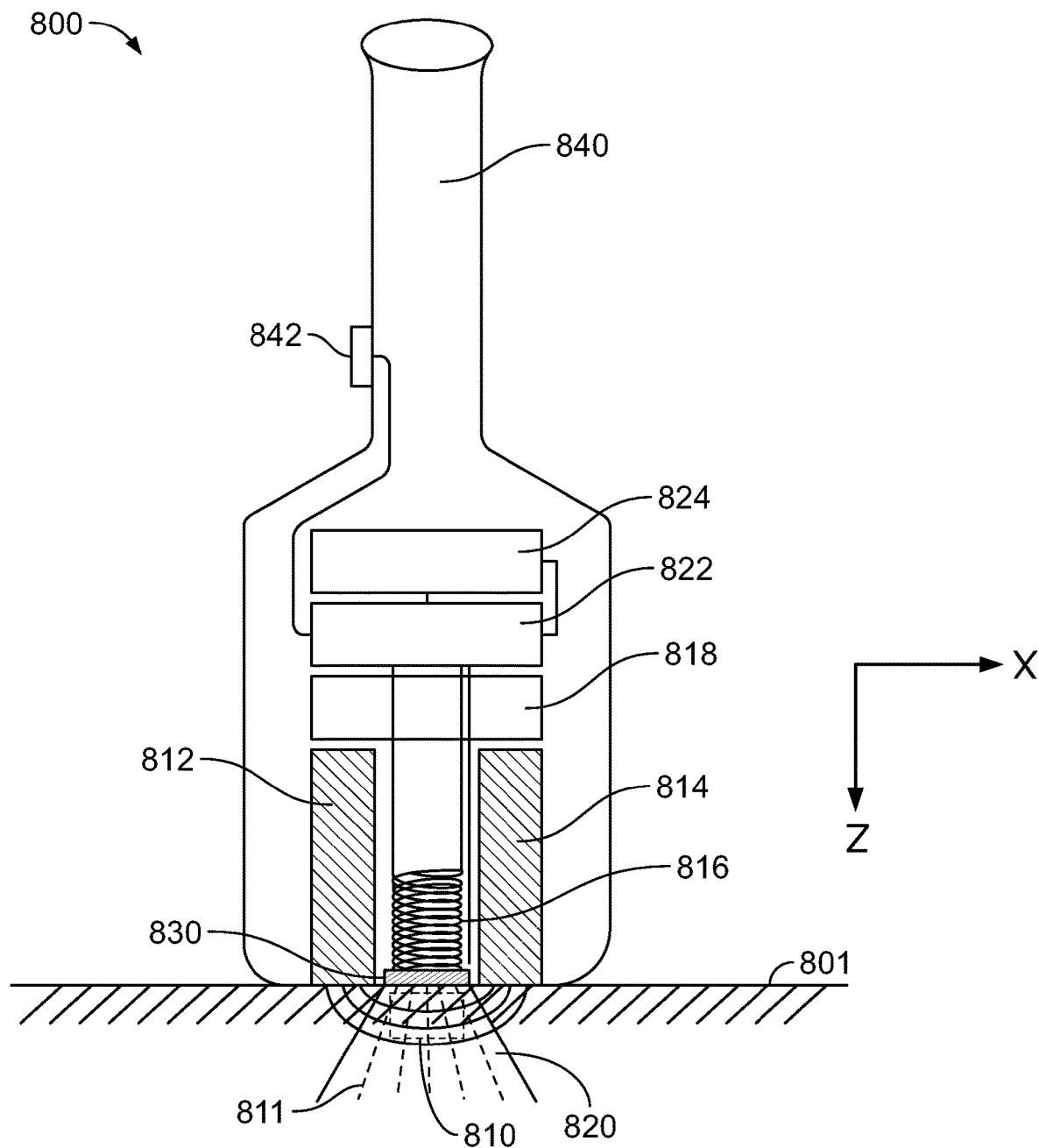
FIG. 8A is a schematic diagram of an embodiment of a handheld MRI-ultrasound device.
Figure 8B:
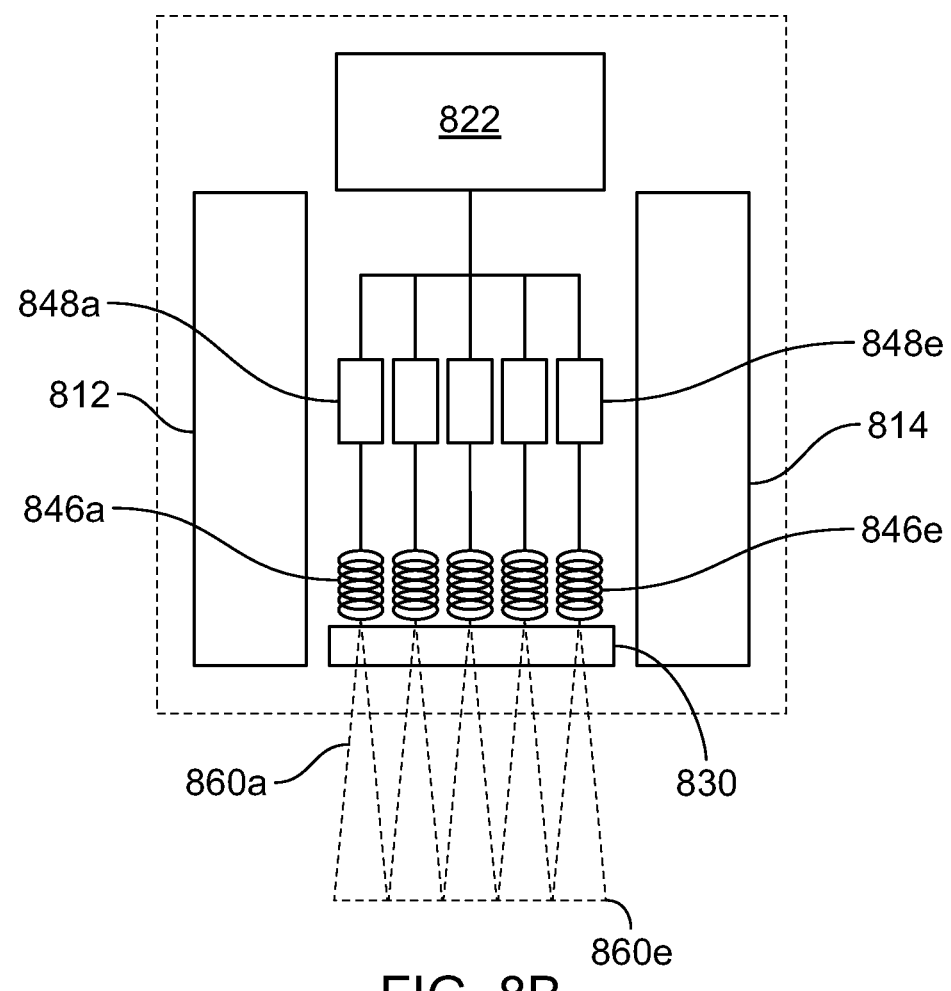
FIG. 8B is a schematic diagram of components of a further embodiment of a handheld MRI-ultrasound device.

In some embodiments, permanent magnets are used in compact MRI systems. For example, permanent magnets can be used in handheld MRI scanners. Referring to FIGS. 7A and 7B, a handheld MIll scanner 700 includes a pair of permanent magnets 712 and 714 and an RF coil arranged to probe a measurement region 710 in a subject 701. Scanner also includes an iron core 720, a control module 722, and a battery 730 (or other power source). A user grips scanner 700 with handle 740 and operates the scanner using switch 742 (or more complex interface, e.g., including multiple control switches/buttons/knobs, etc.). A Cartesian coordinate system is provided for reference.

Permanent magnets are arranged with their poles aligned along the z-axis so that the magnetic flux lines 711 are parallel to the z-axis at the surface of subject 701. These fringing fields curve in the x-direction providing a region of sufficient magnetic field homogeneity in a region 710 just below the surface of the subject. Here, the field lines 711 are substantially parallel to the x-direction. While the permanent magnets are formed as two rectangular blocks, in general various form factors are possible. For example, fringe fields can be provided from a horseshoe magnet or parallel disk magnets (e.g., as depicted in FIG. 1. In some embodiments, a fringe field from a single magnet can be used with fringes between each polarity end. In certain embodiments, a ring magnet with sample in the ring's hole in the middle and magnetic poles on the inner diameter and outer diameter can be used.

Two magnetic field sensing and coil arrays 752 and 754 are positioned adjacent the ends of magnets 712 and 714, respectively. As discussed above, these arrays sense a local magnetic field strength and provide a locally-varying field in response in order to shim the magnet field from the permanent magnets.

Iron core 720, through the ferromagnetic properties of the iron (or similar magnetically permeable material), service to increase the strength of the magnetic field of the system and close the loop in the magnetic circuit.

RF coil 716 is arranged with its axis parallel to the z-direction so that, when energized, the coil induces a magnetic field, $B_1$, with field lines 713 penetrating sample region 710 substantially parallel to the z-direction and substantially perpendicular to field lines 711, $B_0$. Generally, the $B_1$ field lines will fan out from the coil and the $B_0$ field lines will curve through the sample between magnet 712 and 714, but the system can be designed so that locally these field lines are mutually substantially perpendicular to each other.

Control module 722 generally includes electronic control and data processing electronics for receiving operating commands from the user, e.g., via switch 742, and providing control signals to the RF coil. In some embodiments, control module 722 includes transceiver (e.g., a wireless transceiver, using bluetooth or wife radio) that facilitates interfacing with another device, such as a computer, tablet computer, or smartphone. For example, control module 722 can send MRI data collected using scanner 700 to a physically separate computer terminal 799 or other dedicated data processing apparatus for analysis and presentation.

During operation, the user can move scanner 700 relative to subject 701 to image different sample regions of the subject. The scanner can include motion and position sensors to track relative motion between the scanner and subject and use this information to reconstruct 3D MRI images of the subject corresponding to the volume of the subject that the user scans.

The MR imaging voxel region 710 in the z-direction can be varied in one or more different ways. This can be achieved by the Larmor frequency and/or by varying the nominal magnetic field strength $B_0$ in region 710. This can be achieved using magnetic coil arrays to shim the field and/or by mechanically manipulating the z-position of both the $B_0$ (permanent magnets) and $B_1$ (RF coil) fields relative to the scanner's housing using an actuator, e.g., an encoded linear actuator, perpendicular to the surface of the subject of measurement. This varies MR voxel depth (Z-axis) while manually moving the device from point to point in the transverse, X-Y plane.

In some embodiments, additional sensors can be combined with a MRI system to provide additional modalities for interrogating a sample. For example, referring to FIG. 8A, a handheld scanner 800 combines an ultrasound sensor with a MRI sensor. The form factor of scanner 800 is similar to that of scanner 700 and includes a pair of permanent magnets 812 and 814 and an RF coil 816 arranged to probe a measurement region 810 in a subject 801. Scanner 800 also includes an iron core 818, a control module 822, and a battery 824 (or other power source). A user grips scanner 800 with handle 840 and operates the scanner using switch 842. A Cartesian coordinate system is provided for reference. Although not illustrated in FIG. 8A, sensor 800 can include one or more magnetic field sensor arrays and/or magnetic coil arrays, as described above.

Scanner 800 also includes an ultrasound integrated circuit sensor 830 located coaxially with RF coil 816 and against the edge of scanner 800 that contacts subject 801. This allows the ultrasound sensor 830 to be in intimate contact with the edge of the device and well-coupled to the object under investigation. Being in close and known proximity to the MRI detection coil affords the ability to correlate respective MR and ultrasound data.

Ultrasound integrated circuit sensor 830 includes an array of ultrasound transducers arranged to direct ultrasound waves into a sample volume 820 that includes measurement region 810 and detect ultrasound signals reflected from tissue in the region. In some embodiments, sensor 830 is a commercially-available sensor, such as the sensor available from Butterfly Networks (Guilford, Conn.).

In general, ultrasound integrated circuit sensor 830 can operate at a variety of frequencies as is convention to highlight different tissues or elasticities.

During operation, scanner 800 simultaneously acquires both MR imaging data and ultrasound imaging data of the same sample region, allowing the system to present images of structure and composition of that region using both imaging modalities.

Calibration of MR voxel to ultrasound images can be achieved by measuring known factory samples, Larmor frequency, and/or linear actuator position. The results is a mapping file of ultrasound to MRI which is loaded to the device and used as a correction factor. Data manipulation and image processing maps MRI to ultrasound images and can be viewed and analyzed in a variety of means by highlighting areas of dimensional data overlap like, for example, color coding by tissue type and elastic properties.

While scanners 700 and 800 are depicted as including a single RF coil, other implementations are also possible. For example, referring to FIG. 8B which shows components of an alternative configuration of scanner 800, in some embodiments a scanner can include multiple RF coils (846a-846e) adjacent ultrasound sensor 830. Here, five RF coils are depicted but more generally, other array sizes are possible. RF coil arrays can be one or two dimensional arrays. Each RF coil 846a-846e is coupled to a corresponding receiver 848a-848e so that each represents a parallel RF detection channel for the system. In this way, the sensor can utilize parallel excitation and parallel reception of multiple magnetic resonance signals from corresponding sample volumes 860a-860e, respectively. Sample volumes 860a-860e overlap with the measurement region probed by ultrasound sensor 830.

Use of multiple RF coils for parallel MR imaging can facilitate rapid imaging of a sample as a user moves the scanner across a subject.

Advantages of combining MRI and ultrasound data are more highly multi dimensionalized imaging data from tissue type (water, lipid, and macromolecules), short and long TE and TR pulse sequences, tissue density differences, and tissue elasticity from ultrasound elastography.

In general, a variety of pulse sequence types can be used with the disclosed embodiments to obtain NMR or MRI data. In some embodiments, particularly where the sample volumes are small, it is advantageous to use sequences that will provide relatively large magnetic resonance signals. For example, pulse sequences that are known to work well in semi-homogeneous environments and/or pulse sequences that maximize observation time can be used (e.g., spin-echo and steady-state free precession sequences).

In certain embodiments, navigator echoes can be used. These refer to pulse sequences that are included for the purpose of object sensing or motion sensing, for example, rather than for imaging. Navigator pulse sequences can be included periodically between imaging pulse sequences in order to monitor relative motion between the scanner and the subject, for example.

In some embodiments, the ultrasound data can be used to facilitate more efficient and/or accurate MRI measurements. For example, in some embodiments, the ultrasound data can be used to calibrate the magnets using magnetic resonance methods on the subject itself, eliminating or curtailing need for other sensors in order to do so. For instance, the ultrasound data can be used to identify surface contours of the subject that have same acoustic response (and will likely have same magnetic resonance response), and where these surfaces lie relative to the magnet's "expected" field contours. Knowledge of these subject surfaces, combined with a magnetic resonance scan or navigator echoes, can then be used to refine the B0 field map by disambiguating the magnetic resonance data.

In certain embodiments, the ultrasound data can be used to design magnetic resonance pulse sequences that are more efficient for the specific subject than generic pulse sequences. For instance, by tailoring excitation pulses and/or gradient sampling to the known spatial extent and complexity features of the subject, more efficient and/or detailed imaging can be obtained. Generally, pulse sequences can be optimized for parameters such as TE, flip angle, T1/T2 weightings, among others. Pulse sequence optimization can be based on the acoustic density data about the subject. For example, the sequences can be varied depending on whether bone, cartilage, fat, or muscle are being imaged.

Ultrasound data can be used to accelerate magnetic resonance image data reconstruction. For example, reconstruction can be performed by subsampling and then disambiguation or the MR signals based on the ultrasound data. The subsampling can be performed in spatial domain or spatial-frequency domain.

While scanner 800 has a form factor suitable for imaging a subject from its surface (e.g., external to a patient), other implementations are also possible. For example, in some embodiments, smaller form factors can be used to enable magnetic resonance and ultrasound fusion through surgical incisions or through bodily orifices to image from inside an object or body. This is convention with pelvic ultrasound as one example. Combining such ultrasound devices with MR extend the data dimensionality of ultrasound and scanning depth of single sided MRI.

While scanners 700 and 800 are contemplated for use in conventional medical ultrasound, NMR and MRI uses (e.g., on human or veterinary subjects), they can be used for non-destructive imaging more generally. More generally, scanners that implement the disclosed technologies can be provided in a variety of form factors suitable for different purposes, such as imaging of plants (e.g., foods like fruits and vegetables), non-living (e.g., meats, like beef and fish) and even non-biological samples. In some embodiments, the disclosed scanners can be used in quality control (e.g., food quality) or forensics.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively, or in addition, the program instructions can be encoded on an artificially-generated propagated signal, e.g., a machine-generated electrical, optical, or electromagnetic signal that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them. Data processing apparatus can be incorporated into or in communication with the electronic controllers described above.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone, running a messaging application, and receiving responsive messages from the user in return.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

Figure 9:
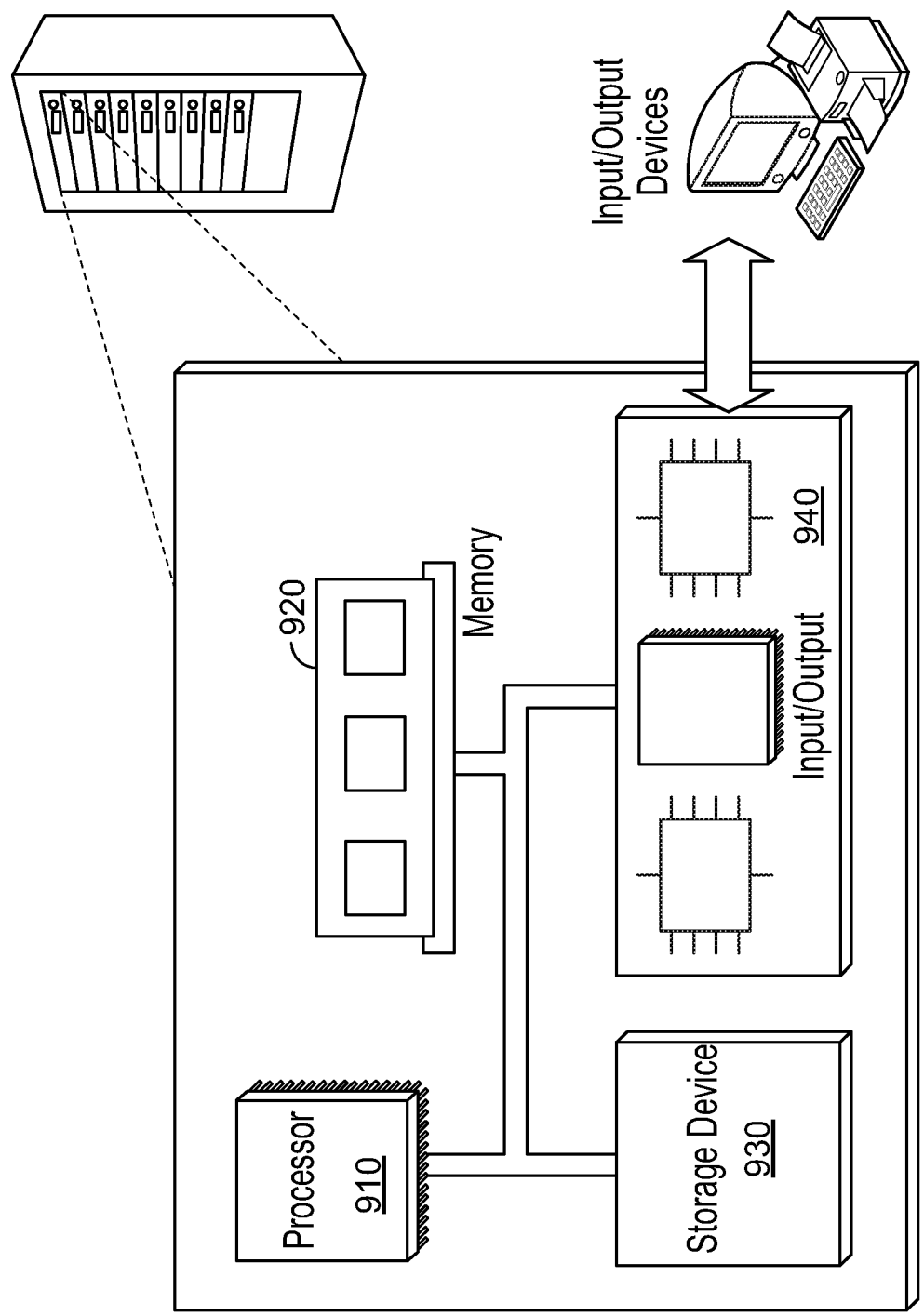
FIG. 9 is a schematic diagram of a computer system that can be used with or form part of the foregoing embodiments.

An example of one such type of computer is shown in FIG. 9, which shows a schematic diagram of a generic computer system 900. The system 900 can be used for the operations described in association with any of the computer-implemented methods described previously, according to one implementation. The system 900 includes a processor 910, a memory 920, a storage device 930, and an input/output device 940. Each of the components 910, 920, 930, and 940 are interconnected using a system bus 950. The processor 910 is capable of processing instructions for execution within the system 900. In one implementation, the processor 910 is a single-threaded processor. In another implementation, the processor 910 is a multi-threaded processor. The processor 910 is capable of processing instructions stored in the memory 920 or on the storage device 930 to display graphical information for a user interface on the input/output device 940.

The memory 920 stores information within the system 900. In one implementation, the memory 920 is a computer-readable medium. In one implementation, the memory 920 is a volatile memory unit. In another implementation, the memory 920 is a non-volatile memory unit.

The storage device 930 is capable of providing mass storage for the system 900. In one implementation, the storage device 930 is a computer-readable medium. In various different implementations, the storage device 930 may be a floppy disk device, a hard disk device, an optical disk device, or a tape device.

The input/output device 940 provides input/output operations for the system 900. In one implementation, the input/output device 940 includes a keyboard and/or pointing device. In another implementation, the input/output device 940 includes a display unit for displaying graphical user interfaces.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

While the foregoing embodiments all feature the use of permanent magnets, the techniques and system disclosed herein can be applied to devices that use other types of magnets, e.g., electromagnets, as well.

A number of embodiments have been described. Other embodiments are in the following claims.

What is claimed is:

1. A nuclear magnetic resonance (NMR) apparatus, comprising:
    a pair of permanent magnets spaced apart from each other and defining a sample space, the permanent magnets providing a magnetic field in the sample space;
    an array of magnetic field sensors arranged relative to the sample space to provide, during operation, information about a homogeneity of the magnetic field in the sample space;
    an array of magnetic coils arranged relative to the sample space so that each magnetic coil, during operation, generates a magnetic field that changes the magnetic field in the sample space provided by the permanent magnets; and
    an electronic controller in communication with the array of magnetic field sensors and the array of magnetic coils, the controller being programmed to receive information about the magnetic field in the sample space from the array of magnetic field sensors and to variably energize the magnetic coils in the array of magnetic coils so that the magnetic fields generated by the array of magnetic coils reduces inhomogeneities of the magnetic field in the sample space.

2. The apparatus of claim 1, wherein the permanent magnets comprise a rare earth magnetic material.

3. The apparatus of claim 2, wherein the rare earth magnetic material comprises neodymium or samarium-cobalt.

4. The apparatus of claim 1, wherein the array of magnetic field sensors comprises at least one of Hall effect sensors, magneto-diodes, magneto-transistors, AMR magnetometers, GMR magnetometers, magnetic tunnel junction magnetometers, magneto-optical sensors, Lorentz force based MEMS sensors, Electron Tunneling based MEMS sensors, MEMS compasses, Nuclear precession magnetic field sensors, optically pumped magnetic field sensors, fluxgate magnetometers, search coil magnetic field sensors and SQUID magnetometers.

5. The apparatus of claim 1, wherein the array of magnetic coils comprises a plurality of electrically-conducting wires each wound around a respective axis.

6. The apparatus of claim 5, wherein each wire is printed on a substrate.

7. The apparatus of claim 1, wherein the array of magnetic coils comprises a plurality of substrates stacked on top of one another, each supporting a respective array of wires, each wire being wound around a respective axis.

8. The apparatus of claim 7, wherein each wire in one of the respective arrays of wires is wound around a common axis as a wire in each of the other arrays of wires.

9. The apparatus of claim 1, further comprising a substrate supporting both the array of magnetic field sensors and the array of magnetic coils.

10. The apparatus of claim 9, wherein the array of magnetic field sensors and the array of magnetic coils are on opposing sides of the substrate.

11. The apparatus of claim 9, wherein the substrate comprises a printed circuit board.

12. The apparatus of claim 1, further comprising a housing containing the pair of permanent magnets, the array of magnetic field sensors, and the array of magnetic coils, the housing being sized and shaped for handheld use.

13. The apparatus of claim 12, wherein the pair of permanent magnets are arranged to provide a fringe field in a volume adjacent the housing.

14. The apparatus of claim 13, further comprising one or more RF coils positioned between the pair of permanent magnets.

15. The apparatus of claim 12, wherein the electronic controller comprises at least one computer processor housed external from the housing and at least one component internal to the housing in communication with the at least one computer processor.

16. The apparatus of claim 15, wherein the at least one component and at least one computer processor are in wireless communication.

17. The apparatus of claim 12, further comprising a power source arranged in the housing.

18. The apparatus of claim 17, wherein the power source comprises a battery.

19. The apparatus of claim 1, wherein at least one of the permanent magnets, array of magnetic field sensors, and/or array of magnetic coils are coupled to an actuator configured to rotate and/or displace the corresponding permanent magnet or array with respect to the sample space.

20. The apparatus of claim 1, wherein the apparatus is a nuclear magnetic resonance (NMR) spectrometer.

21. The apparatus of claim 1, wherein the apparatus is a magnetic resonance imaging (MRI) system.

* * * * *